US009667157B1

(12) United States Patent
Dong et al.

(10) Patent No.: US 9,667,157 B1
(45) Date of Patent: May 30, 2017

(54) SYSTEM AND METHOD FOR OPERATING A POWER CONVERTER

(71) Applicant: GENERAL ELECTRIC COMPANY, Schenectady, NY (US)

(72) Inventors: Dong Dong, Schenectady, NY (US); Luis Jose Garces, Niskayuna, NY (US); Mohammed Agamy, Niskayuna, NY (US); Ravisekhar Nadimpalli Raju, Clifton Park, NY (US); Yan Pan, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/140,103

(22) Filed: Apr. 27, 2016

(51) Int. Cl.
*H02M 3/335* (2006.01)

(52) U.S. Cl.
CPC ............... *H02M 3/33515* (2013.01)

(58) Field of Classification Search
CPC ......... H02M 3/33507; H02M 3/33515; H02M 3/33523; H02M 3/3353; H02M 3/33569;
(Continued)

(56) References Cited

U.S. PATENT DOCUMENTS 5,166,549 A * 11/1992 DeDoncker .......... G01R 19/175
323/235
5,781,419 A * 7/1998 Kutkut .............. H02M 3/33569
363/132

(Continued)

FOREIGN PATENT DOCUMENTS

CN 104506038 A 4/2015
JP 5617227 B2 11/2014

OTHER PUBLICATIONS

Hiraki E et al., "Feasible evaluations of space vector modulated three-phase soft-switching PFC rectifier with instantaneous power feedback scheme", Power Electronics and Drive Systems, 2003. PEDS 2003. The Fifth International Conference on, vol. 2, pp. 1126-1131, Nov. 17-20, 2003.

(Continued)

*Primary Examiner* — Yemane Mehari
(74) *Attorney, Agent, or Firm* — Nitin N. Joshi

(57) ABSTRACT

A power converter includes a first bus converter for converting a first direct current (DC) bus voltage into a first high frequency alternating current (AC) voltage and a second bus converter for converting a second high frequency AC voltage into a second DC bus voltage. A resonant circuit couples the first bus converter and the second bus converter. Further, a controller provides switching signals to the first bus converter and the second bus converter to operate the power converter in a soft switching mode. The controller includes a voltage detection circuit connected across at least one switching device of the power converter to detect a device voltage across the at least one switching device and a counter to count a number of hard switching detection pulses of the hard switching pulse signal detector. The controller also includes a calculation module to update the number of hard switching detection pulses of the hard switching instances and to generate a new number of hard switching detection pulses and a comparator to compare the new number of hard switching detection pulses with a threshold value and to provide a control signal if the new number exceeds the threshold value.

19 Claims, 8 Drawing Sheets

(58) Field of Classification Search
CPC ..... H02M 3/33592; H02M 2001/0032; H02M 2007/4815; Y02B 70/1441; Y02B 70/1433
USPC ................. 363/17, 21.01–21.18, 89, 131
See application file for complete search history.

(56) References Cited

U.S. PATENT DOCUMENTS

| | | | |
|---|---|---|---|
| 7,426,120 B2 | 9/2008 | Yang et al. | |
| 7,466,569 B2 | 12/2008 | Yang et al. | |
| 2013/0039099 A1* | 2/2013 | Wu .................... | H02M 7/53871 363/40 |
| 2015/0131333 A1* | 5/2015 | Grosso .............. | H02M 3/33515 363/21.01 |

OTHER PUBLICATIONS

Guofeng Zhu et al., "A soft-switching multi-phase converter with coupled inductors and switch-time-delay control", Applied Power Electronics Conference and Exposition (APEC), 2015 IEEE, pp. 2063-2068, Mar. 15-19, 2015, Charlotte, NC.

* cited by examiner

SYSTEM AND METHOD FOR OPERATING A POWER CONVERTER

BACKGROUND

Embodiments of the invention relate generally to power converters and more specifically to system and method for operating a power converter such as a direct current (DC) to DC power converter or a DC to alternating current (AC) power converter.

DC to DC power converters are very prevalent in today's power system. There are many applications of DC to DC converters, e.g., power supplies for cell phones, laptops etc. Even in hybrid electric vehicles or military/civil aircrafts DC to DC converters may be used. For offshore applications, such as marine, there are variety of loads which may be fed by DC power supply. In such marine ships, many DC buses which are interconnected so as to transfer power therebetween may be utilized. The interconnections between DC buses require coupling the DC buses with DC to DC converters. Generally, the efficiency of the overall marine power architecture needs to be high which in turn requires highly efficient DC to DC converters. Thus, in many embodiments, soft switching is employed for controlling DC to DC converters. Soft switching of DC to DC converters reduces switching losses of the DC to DC converters.

In marine ships, where the power requirements are high, the DC to DC converters may need to be operated at high voltages. Since the DC to DC converters need to be operated at high voltages, in many embodiments, a plurality of series connected semiconductor devices are utilized. With the large number of semiconductor devices in series and their associated snubber circuit, conventional control method will lead to loss of soft switching during transient conditions and lower converter efficiency.

Therefore, it is desirable to provide a system and a method that will address the foregoing issues.

BRIEF DESCRIPTION

In accordance with an embodiment of the present technique, a power converter is provided. The power converter includes a first bus converter for converting a first direct current (DC) bus voltage into a first high frequency alternating current (AC) voltage and a second bus converter for converting a second high frequency AC voltage into a second DC bus voltage. Further, the power converter includes a resonant circuit for coupling the first bus converter and the second bus converter and a controller for providing switching signals to the first bus converter and the second bus converter to operate the power converter in a soft switching mode. The controller includes a voltage detection circuit connected across at least one switching device of the power converter to detect a device voltage across the at least one switching device and a hard switching pulse signal detector to generate hard switching detection pulses based on the device voltage and a reference voltage when a hard switching instance of the at least one switching device is detected. The controller further includes a counter to count a number of hard switching detection pulses of the hard switching pulse signal detector and a calculation module to update the number of hard switching detection pulses of the hard switching instances and to generate a new number of hard switching detection pulses. The controller further includes a comparator to compare the new number of hard switching detection pulses with a threshold value and to provide a control signal if the new number exceeds the threshold value.

In accordance with another embodiment of the present technique, a method of operating a power converter having a first bus converter coupled to a second bus converter by a resonant circuit is provided. The method includes detecting a device voltage across at least one switching device of the first bus converter or the second bus converter and generating hard switching detection pulses based on the device voltage and a reference voltage when a hard switching instance of the at least one switching device is detected. The method also includes counting a number of hard switching detection pulses of the hard switching instances of the at least one switching device and updating the number of hard switching detection pulses with a new number of hard switching detection pulses. The method further includes comparing the new number of hard switching detection pulses with a threshold value and generating a control signal if the new number of hard switching detection pulses exceeds the threshold value.

DRAWINGS

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings. The connections may include direct connections. Furthermore, the terms "circuit" and "circuitry" and "controller" may include either a single component or a plurality of components, which are either active and/or passive and are connected or otherwise coupled together to provide the described function.

Figure 1:
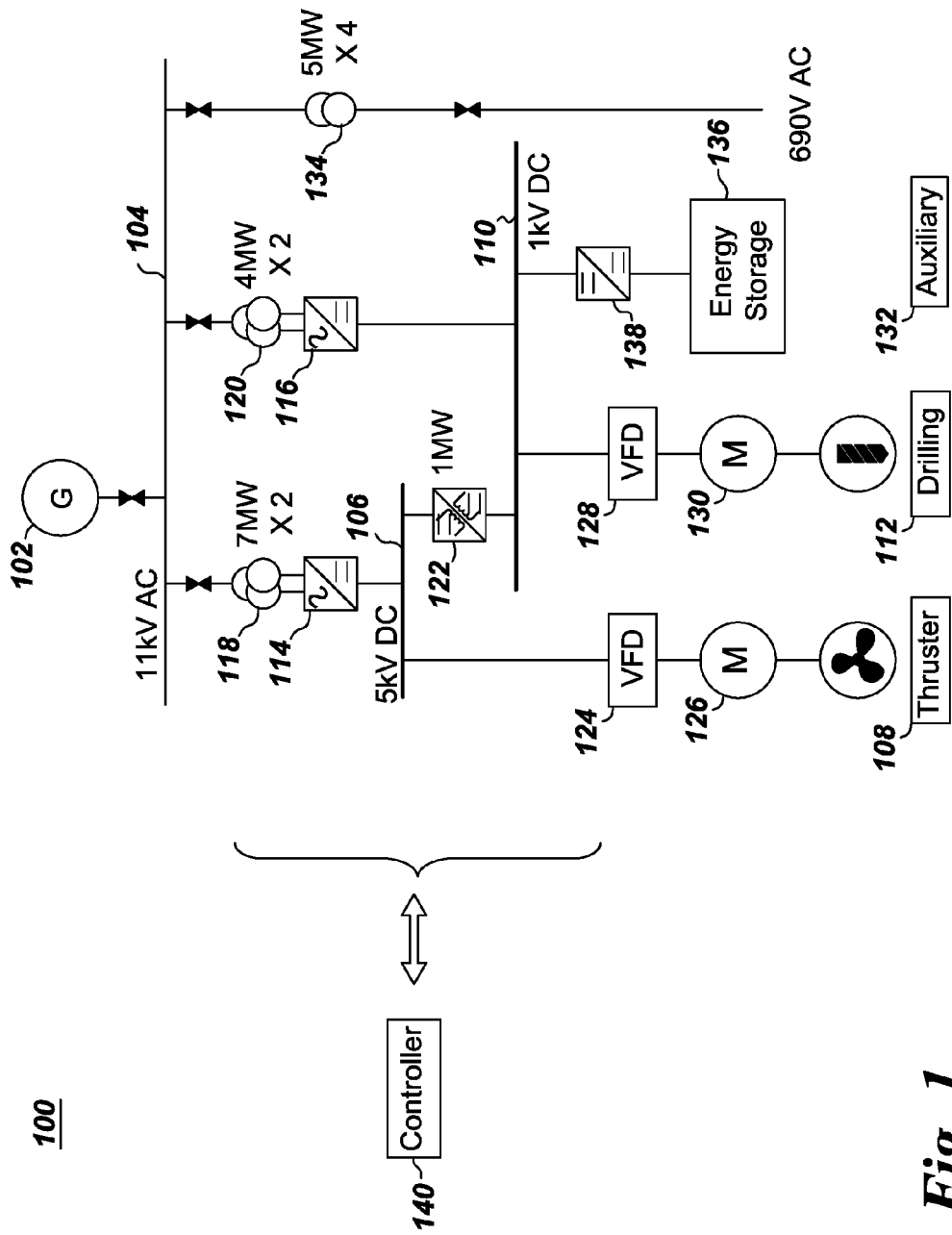
FIG. 1 is a diagrammatical representation of a power system for a marine ship, according to aspects of the present disclosure.

Turning now to the drawings, by way of example in FIG. 1, a power system 100 for a marine ship is depicted. In one embodiment, the power system 100 includes a generator 102 coupled to an alternating current (AC) bus 104. The generator 102 includes an AC generator which generates AC power for the marine ship. The AC bus 104 supplies power to an auxiliary load 132 via a transformer 134. The auxiliary load 132 may operate at lower voltage compared to the AC voltage of the AC bus 104. Therefore, the transformer 134 reduces the AC voltage of the AC bus to the level suitable for the auxiliary load 132. In one embodiment, the auxiliary load may include service load.

The power system 100 further includes a first direct current (DC) bus 106 having a first DC voltage to supply power to a first load 108. Further, a second DC bus 110 having a second DC voltage supplies power to a second load 112. The AC bus 104 supplies power to the first and second DC buses 106, 110. The first load 108 may include a Thruster load and the second load 112 may include a drilling load. In one embodiment, the second DC voltage is lower than the first DC voltage. The first load 108 may be operated and controlled by a variable frequency drive 124 which controls a first load motor 126. Similarly, the second load 112 may also be operated and controlled by another variable frequency drive 128 which controls a second load motor 130.

Furthermore, a first AC to DC converter 114 couples the AC bus 104 and the first DC bus 106. Similarly, a second AC to DC converter 116 couples the AC bus 104 and the second DC bus 110. In one embodiment, transformers 118 and 120 are connected between the AC bus 104 and first and second AC to DC converters 114, 116 respectively to reduce the AC voltage level of the AC bus 104 that is supplied to AC to DC converters 114, 116. It should be noted that if in one embodiment, the AC voltage level matches the voltage of AC to DC converters 114, 116 then the AC bus 104 can be directly connected to the AC to DC converters without transformers.

A first DC to DC converter 122 is coupled between the first DC bus 106 and the second DC bus 110. The first DC to DC converter 122 includes a bidirectional converter and can transfer power either from first DC bus 106 to second DC bus 110 or vice versa. Furthermore, the DC to DC converter 122 includes a high frequency DC to DC converter.

In one embodiment, an energy storage device 136 may be coupled to the second DC bus 110 via a power electronic converter 138 to supply DC power to the second DC bus 110. In another embodiment, the energy storage device 136 may be coupled to the first DC bus 106. In yet another embodiment, energy storage devices may be coupled to both the first DC bus 106 and the second DC bus 110. Further, in some embodiments, energy storage may not be utilized or connected to any of the first or second DC buses 106, 110. The power electronic converter 138 may be utilized to match the voltages of energy storage device and the DC bus 110.

Power System 100 further includes a controller 140 to control the operation of AC to DC converters 114, 116, DC to DC converter 122 and other elements of the power system 100. It should be noted that even though a single controller 140 is shown in the embodiment of FIG. 1, in other embodiments controller 140 may be split into a plurality of controllers and each individual controller may control a part of the power system 140. Power system 100 may also include passive devices such as fuses and/or circuit breakers (not shown) to protect a second of the power system 100 during a fault (e.g., short circuit fault).

It should be noted that FIG. 1, is a single line diagram of DC power system 100. In other words, converters 122, 138 have been shown to have only one DC input terminal and one DC output terminal for ease of explanation. However, a negative terminal or a reference terminal is always there at the input and the output of converters 122, 138. Similarly, DC buses 106, 110 include a positive rail and a negative rail but for ease of explanation only one line is shown.

In accordance with an embodiment of the present technique, a control technique for DC to DC converter 122 of FIG. 1 is disclosed. Generally it is required to have high efficiency for all converters and thus, the control technique presented herein discloses a method for soft switching the DC to DC converter 122 in a highly efficient manner.

It should be noted that although the embodiments of the present technique are disclosed with respect to a marine application, the techniques are equally applicable to other applications such as a solar power converter, medium voltage direct current (MVDC) system or even low voltage direct current (LVDC) system. Further, although the embodiments are disclosed with respect to a DC to DC converter, the techniques are equally applicable to AC to DC or DC to AC converters.

Figure 2:
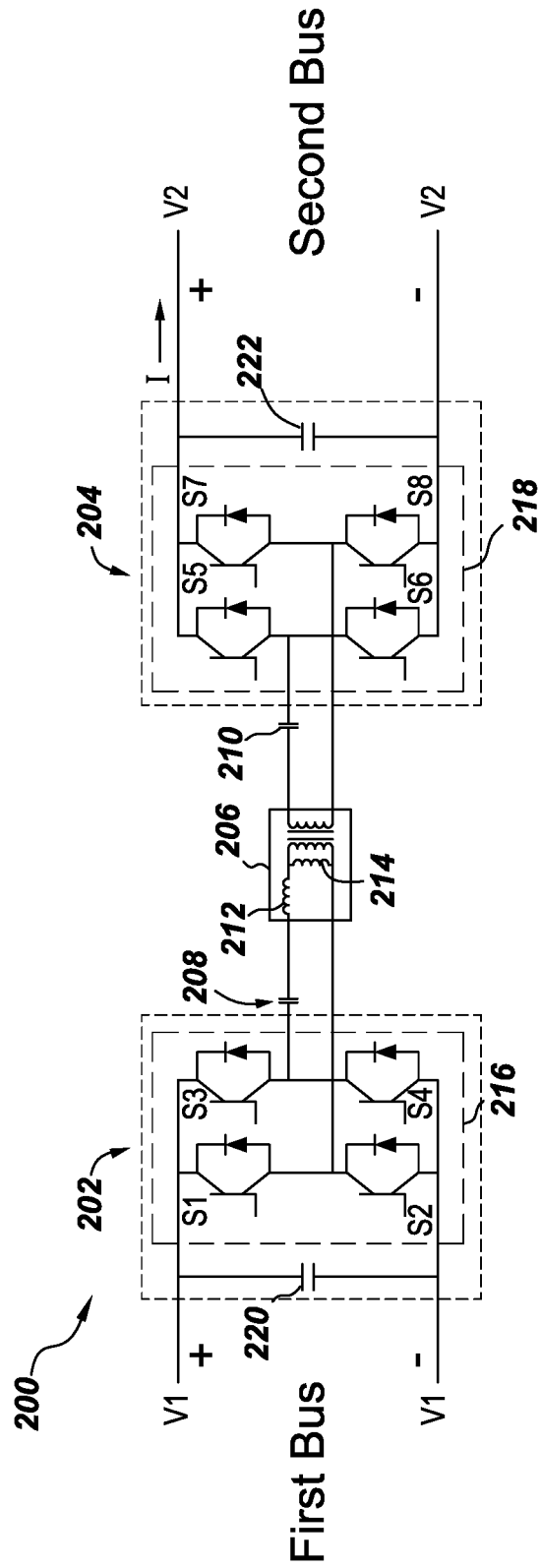
FIG. 2 is a schematic representation of a DC to DC converter of FIG. 1, according to aspects of the present disclosure.

FIG. 2 shows a schematic representation of a DC to DC converter 200 such as DC to DC converter 122 of FIG. 1, in accordance with an embodiment of the present technique. DC to DC converter 400 is a high frequency (e.g., 500 Hz to 100 kHz) converter. Further, DC to DC converter 200 is a resonant LLC dual active bridge converter, where resonant LLC refers to a resonant circuit formed by a series connection of one inductor L and capacitor C, in parallel with another inductor L. Conventional DC to DC converters utilize a hard switching technique (i.e., switching waveforms of their switching devices are square waveforms) and therefore they have high switching losses as they switch at about the peak voltage or current values of square waveforms. As compared to these conventional converters, the resonant LLC dual active bridge converter described herein utilize a soft switching technique i.e., the switching devices in resonant LLC dual bridge converter switch at close to zero voltage or zero current because of the resonant circuit formed by inductor and capacitor components. In other words, in one embodiment, the LLC resonant circuit of the DC to DC converter 200 creates an oscillating current waveform that lags the voltage waveform. This helps in discharging a switching device capacitance before the actual switching and thus, in achieving zero voltage switching. Thus, the devices can then turn ON or OFF at a low voltage or a low current instead of the high voltage or the high current (because of sharp rise of voltage/current in square waveforms) in conventional converters which do not use any soft switching technique.

In the embodiment shown, DC to DC converter 200 is connected between a first bus (e.g., bus 106 of FIG. 1) and a second bus (e.g., bus 110 of FIG. 1) and includes a DC to high frequency AC conversion stage followed by a high frequency AC to DC conversion stage. DC to DC converter 200 is a bidirectional converter, i.e., DC to DC converter 200 allows power transfer from the first bus to the second bus and vice versa. Specifically, DC to DC converter 200 includes a first converter 202 and a second converter 204. First converter 202 and second converter 204 are coupled to each other via a high or medium frequency transformer 206, resonant capacitors 208, 210 and resonant inductors 212 and 214. First converter 202 and second converter 204 include full bridge converters 216 and 218 respectively and DC bus capacitors 220, 222 on their DC sides as shown. Full bridge converter 216 includes a plurality of switching devices S1, S2, S3 and S4. Similarly, full bridge converter 218 includes a plurality of switching devices S5, S6, S7 and S8. The switching devices may include any controllable semiconductor switches such as an Insulated Gate Bipolar Transistor (IGBT), a metal oxide semiconductor field effect transistor, a field effect transistor, a gate turn-off thyristor, an insulated gate commutated thyristor, an injection enhanced gate transistor, a silicon carbide based switch, a gallium nitride based switch, a gallium arsenide based switch, or combinations thereof. Further, in one embodiment, transformer 206 may not be employed and resonant components and first converter 202 and second converter 204 may be directly connected to each other without any isolation.

A first resonant capacitor 208 is connected in series with a first resonant inductor 212 and the terminals of a second resonant inductor 214 are connected in parallel to a first winding of the transformer 206. The first winding of the transformer receives a first high frequency AC voltage from first converter 202. Further, terminals of the series connection of the first resonant inductor 212 and first resonant capacitor 208 are connected between one AC output terminal of first converter 202 and one input terminal of transformer 206. A second resonant capacitor 210 is connected is connected between one output terminal of a second winding of transformer 206 and one AC input terminal of second converter 204. The second winding of the transformer provides a second high frequency AC voltage to the second converter 204. The second high frequency AC voltage is determined by transformer turns ratio and the first high frequency AC voltage. When the switching devices are switched ON or OFF, a resonant circuit formed by inductors and capacitors produce oscillating current through the switching devices and thus soft switching can be achieved. It should be noted that resonant inductors 212 and 214 may be part of the transformer 206 itself. For example, inductor 212 may represent leakage inductance of transformer 206 and inductor 214 may represent magnetic inductance of the transformer 206. In one embodiment, both inductors 212 and 214 can be placed on both sides of transformer 206.

In operation, if the power needs to be transferred from the first bus to second bus then first converter 202 will act as a DC to high frequency AC converter and second converter 204 will act as a high frequency AC to DC converter. In this case, first converter 202 converts an input DC voltage V1 (also referred to as a first bus voltage) into medium/high frequency AC voltage and second converter 204 converts medium/high frequency AC voltage into an output DC voltage V2 (also referred to as a second bus voltage). Similarly, if the power needs to be transferred from the second bus to the first bus then second converter 204 will act as a DC to high frequency AC converter and first converter 202 will act as a high frequency AC to DC converter. Transformer 206 provides a coupling between AC connections of first converter 202 and AC connections of second converter 204. Further, the resonant circuit formed by inductors 212, 214 and capacitors 208, 210 provides soft switching of switching devices as explained earlier.

Figure 3:
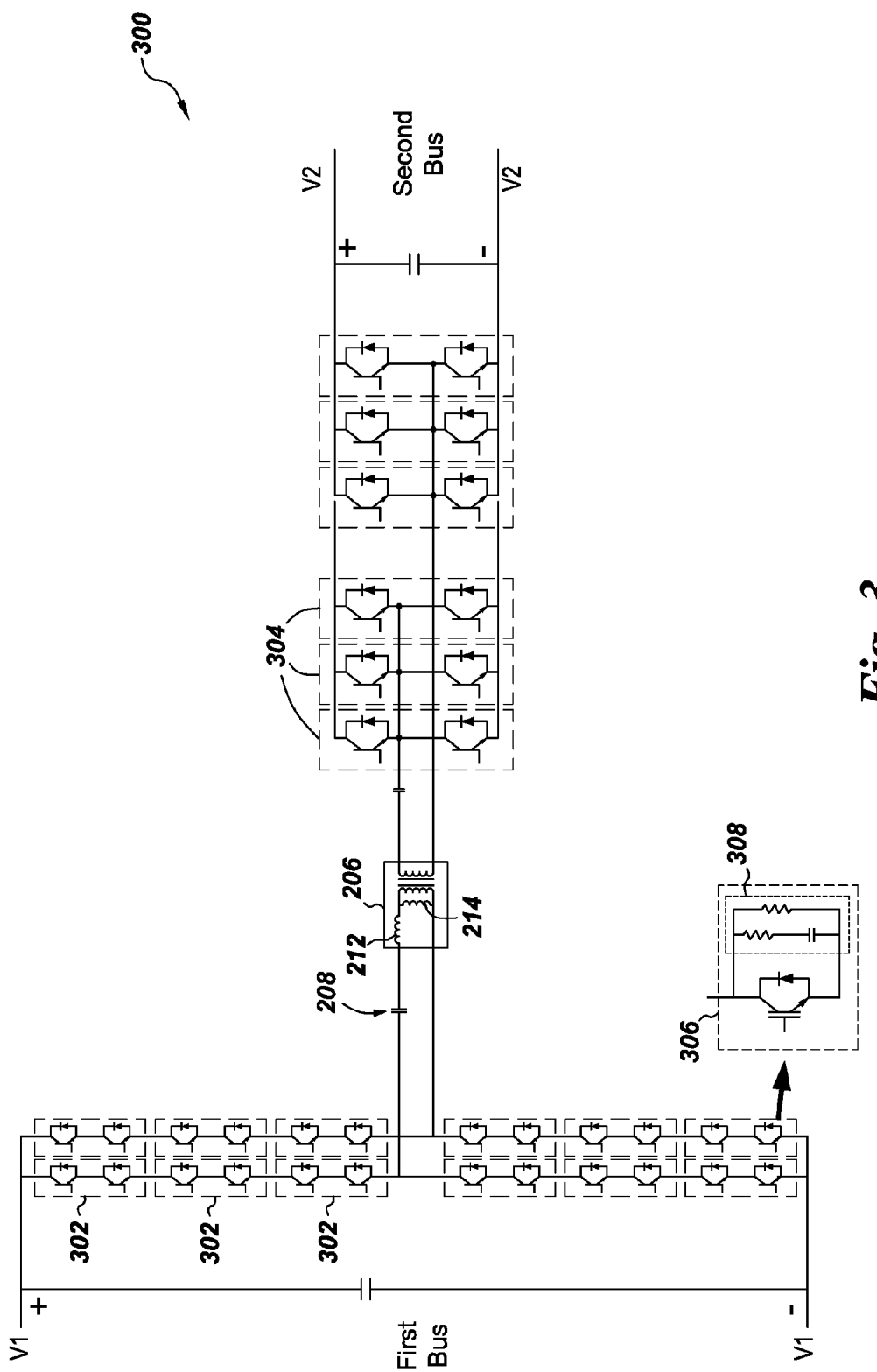
FIG. 3 is a schematic representation of a resonant LLC dual active bridge converter, according to aspects of the present disclosure.

FIG. 3 shows a schematic representation of a resonant LLC dual active bridge converter 300 in accordance with an embodiment of the present technique. In converter 300 of FIG. 3, each switching device (i.e., S1, S2, S3, S4) of full bridge converter 216 (FIG. 2) is replaced with series connected switching modules 302. In another embodiment, each switching device may be replaced with series connected semiconductor switches having snubber circuits. This provides a higher voltage capability for full bridge converter 216 as the series connected switching devices together can withstand higher voltages while still enabling high frequency switching. Further, each switching device (i.e., S5, S6, S7, S8) of full bridge converter 218 (FIG. 2) is replaced with three parallel connected switching devices 304. This provides a higher current capability for IGBT converter 219 as the parallel connected switching devices together can carry higher current. The switching devices may be include any controllable semiconductor switches such as an IGBT, a metal oxide semiconductor field effect transistor, a field effect transistor, a gate turn-off thyristor, an insulated gate commutated thyristor, an injection enhanced gate transistor, a silicon carbide based switch, a gallium nitride based switch, a gallium arsenide based switch, or combinations thereof.

FIG. 3 also shows a detailed view of one switching device 306 among the series connected switching devices. As can be seen, the switching device 306 includes a snubber circuit 308 across its terminals to ensure proper voltage sharing between all the series connected switching devices. The snubber circuit 308 includes a RC snubber. In another embodiment, snubber circuit 308 may include a RCD snubber. This snubber circuit of each of the switching devices adds more restrictions on the converter in order to provide soft switching. At transient conditions there may even be a loss of soft switching. In other words, at transient conditions, a hard switching may occur which may affect the overall operation of the converter 300. In one embodiment, if this hard switching continues for a long time, the converter 300 may need to be shut down. In accordance with an embodiment of the present technique, a hard switching detector is utilized to determine this loss of soft switching and further, when the hard switching is detected, the controller provides appropriate control signals to the converter 300.

Figure 4:
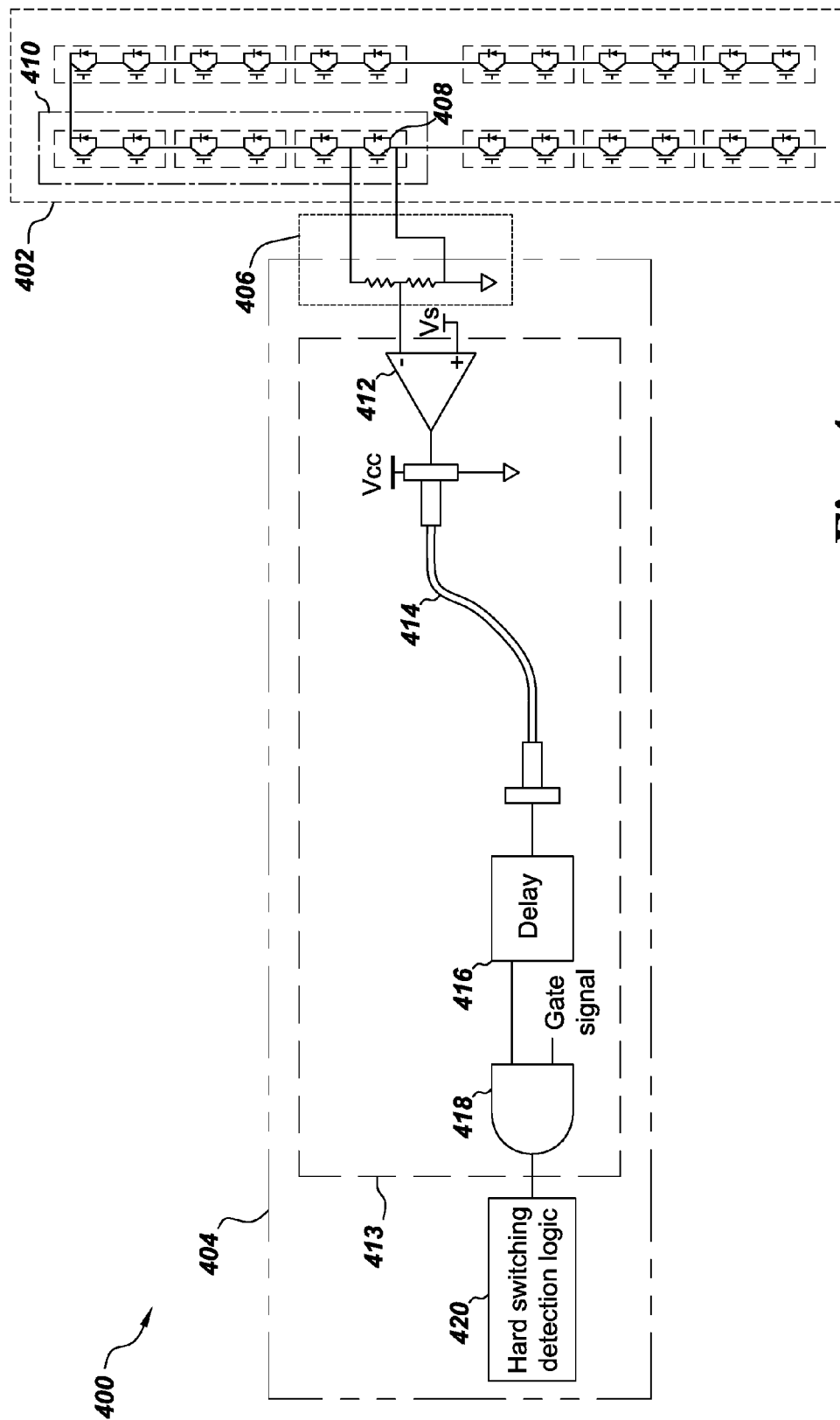
FIG. 4 is a schematic representation of a converter section and a hard switching detector, according to aspects of the present disclosure.

FIG. 4 shows a schematic representation of 400 of a converter section 402 and a hard switching detector 404 in accordance with an embodiment of the present technique. Converter section 402 is a part of a converter 300 shown in FIG. 3. The hard switching detector 404 includes a voltage detection circuit such as a voltage divider circuit 406 which is connected across a switching device 408 of converter section 402 and a hard switching pulse signal generator or detector 413 which generates hard switching detection pulses when hard switching instances of the switching device 408 are detected. The switching device 408 is a bottom device of a top leg portion 410 of converter section 402.

The voltage divider circuit 406 detects a device voltage Vd across switching device 408. It should be noted that the device voltage Vd detected by voltage divider circuit 406 may be a small proportion of the actual voltage across the switching device 408. The proportion may be determined by ratio of the resistors in the voltage divider circuit 406. The device voltage is then compared with a reference voltage Vs. The reference voltage Vs is a representation of the voltage across the switching device 408 when it is switched off. As an example, if the proportion determined by the voltage divider circuit is 2% and full voltage across the switching device 408 is 1 kV when it is switched off then the reference voltage Vs may be 20 volts. Further, it should be noted that the switching device 408 will be switched on when its gate signal Vg is high and when the gate signal Vg is low the switching device 408 will be switched off.

The hard switching pulse signal detector 413 includes a first comparator 412 which compares the reference voltage Vs and the device voltage Vd and provides a first detection signal Vf. The first detection signal is high if the reference voltage Vs is higher than the device voltage Vd. On the other hand the first detection signal is low if the reference voltage Vs is equal to the device voltage Vd. The terms high and low refer to a high voltage and a low voltage respectively which are determined based on a respective power supply voltage Vcc.

A fiber optic cable 414 transfers the first detection signal Vf to a delay module 416 of the hard switching pulse signal detector 413. The delay module 416 delays the first detection signal Vf by a delay time. The delay time is dependent on device characteristics such as device turn off time and system parameters such as filter elements. The delay time is introduced to make sure that the detection signal Vf is not high or low temporarily when the gate signal arrives. A logic gate such as an AND logic gate 418 compares the delayed first detection signal with the gate signal of the switching device 408. The output of AND logic gate 418 is a hard switching event detection signal Vhs having hard switching detection pulses which indicates whether at any given instance whether the switching device 408 is operating under hard switching mode or soft switching mode. In general, when the gate signal becomes high, at that time if the delayed first detection signal is also high then the AND logic gate 418 provides a hard switching detection pulse which is indication of hard switching. On the other hand if at the time the gate signal becomes high, the delayed first detection signal is not high then the AND logic gate 418 would not provide any pulse and its output will remain low. It should be noted that the AND logic gate 418 and delay module 416 may be implemented in a field-programmable gate array (FPGA) controller. Further, voltage divider circuit 406 and hard switching detector 404 may be part of the overall controller 140.

Figure 5:
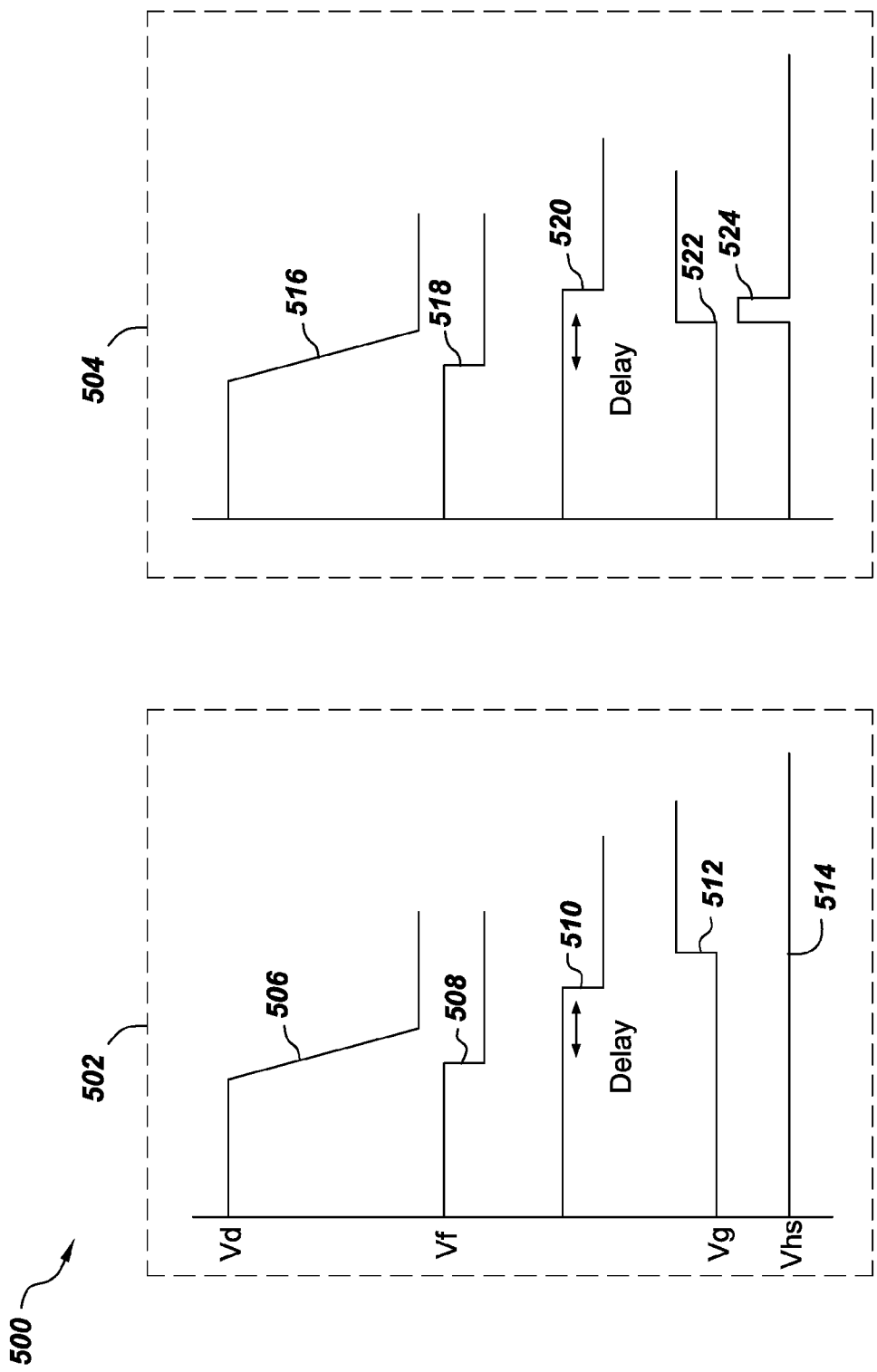
FIG. 5 is a graphical representation of switching waveforms of the converter section of FIG. 4, according to aspects of the present disclosure.

FIG. 5 shows a graphical representation 500 of switching waveforms of converter section 400 of FIG. 4. The graphical representation 500 includes two graphical sections 502 and 504. Graphical section 502 corresponds to switching waveforms when switching device 408 is operating under a soft switching mode and graphical section 504 corresponds to switching waveforms when switching device 408 is operating under a hard switching mode.

Graphical section 502 includes a device voltage waveform 506 which shows actual voltage across switching device 408. Further, graphical section 502 includes a first detection signal waveform 508 which is the output of first comparator 412 and a delayed first detection signal waveform 510 which is the output of delay module 416. The graphical section 502 further includes a gate signal 512 for switching device 408 and a hard switching indication signal waveform 514 which is output of AND logic gate 418.

As explained above graphical section 504 relates to hard switching mode and also includes a device voltage waveform 516, a first detection signal waveform 518, a delayed first detection signal waveform 520, a gate signal 522 and a hard switching indication signal waveform 524.

As can be seen from graphical section 502, when the device is operating under soft switching mode the device voltage 506 becomes low (or zero) before the gate signal 512 becomes high. Thus, the switching device 408 operates under zero voltage switching and hard switching indication signal 514 is throughout low. On the contrary, if the soft switching is lost, then it can be seen from graphical section 504 that the device voltage 516 becomes low after the gate signal 522 becomes high. Thus, during the hard switching mode, the switching device 408 will not operate under zero voltage switching and the hard switching indication signal 524 will provide the hard switching detection pulse to indicate that the device 408 is operating under hard switching.

It should be noted that even if hard switching indication signal provides a hard switching detection pulse to indicate presence of hard switching for switching device 408, the controller may not immediately take corrective action rather the controller will wait for a threshold number of pulses to occur before taking the corrective action. The threshold number may depend on thermal margin of the switching device i.e., it depends on how much heat the device can handle. Thus, in one embodiment, the output pulses of AND logic gate 418 are provided to a hard switching detection logic module 420 in the hard switching detector 404 which determines whether the threshold number of pulses have occurred. In one embodiment, the corrective action by the controller may be switching off the converter in order to protect the converter or related circuit.

Figure 6:
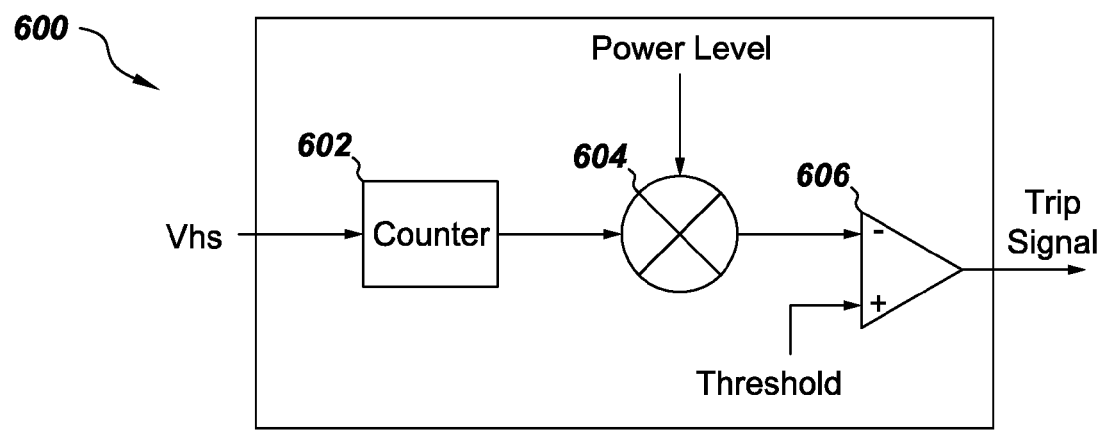
FIG. 6 is a schematic representation of a hard switching detection logic module which may be employed with the converter of FIG. 3, according to aspects of the present disclosure.

FIG. 6 shows a schematic representation of a hard switching detection logic module 600 which may be employed with converter section 400 of converter 300. Hard switching detection logic module 600 includes a pulse counter 602, a calculation module 604, and a second comparator 606. Pulse counter 602 counts the number of pulses in the hard switching detection signal Vhs. The output of counter 602 is multiplied with a power level signal by calculation module 604. In one embodiment calculation module 604 includes a multiplier. In another embodiment, the power level is a per unit value of the actual power being supplied by converter 300. For example, if converter 300 is operating at no load i.e., supplying zero power then the power level signal would be zero. On the other hand if converter 300 is operating at full load i.e., supplying maximum power then the power level signal would be 1. The output of calculation module 604 is compared with a threshold by second comparator 606.

If the output of the calculation module 604 is higher than the threshold then the second comparator 606 may provide a trip signal to switch off converter 300. On the contrary, if the output of the calculation module 604 is lower than the threshold then the second comparator 606 may not provide any such trip signal which indicates that converter 300 can still continue to operate as the instances of hard switching are manageable by converter 300. As the number of pulses in the hard switching detection signal is being multiplied by the power level signal, it can be seen that at high power level, a low number of pulses would trip converter 300 whereas at no or low load, a high number of pulses would be needed to trip converter 300. In another embodiment, the trip signal may be replaced with other control signals which will convert the hard switching events into soft switching events. In order to convert the hard switching events into soft switching events, the converter switching frequency, converter dead time and/or converter phase shift may need to be adjusted. Accordingly the control signals which may replace the trip signal include a switching frequency adjustment signal, a dead time adjustment signal or a phase shift adjustment signal for converter 300.

It should be noted that the converter switching frequency refers to the frequency at which the switching devices are set to be turned on and off. Further, the converter phase shift refers to a phase shift between switching pulses of first converter 202 and second converter 204. Moreover, converter dead time refers to time difference between switching signals of a top and bottom switching devices of the converter leg (e.g., S5 and S6).

In one embodiment, instead of multiplying output of counter 602 with the power level signal, the output of counter 602 is directly compared with the threshold. In such an embodiment, the threshold may be a variable. In other words, in such an embodiment, a fixed threshold may be divided by the power level signal before being compared with the output of counter 602. In another embodiment, hard switching detection logic module 600 also takes additional factors into consideration. For example, a time factor may be used to while comparing the counter pulses of counter 602 with the threshold. In other words, it may be seen whether the total number of pulses within a predefined time duration (e.g., 2 seconds, 3 seconds) exceed the threshold. If not, then the counter is reset 602 so that to start a new counting for the next predefined time duration.

Figure 7:
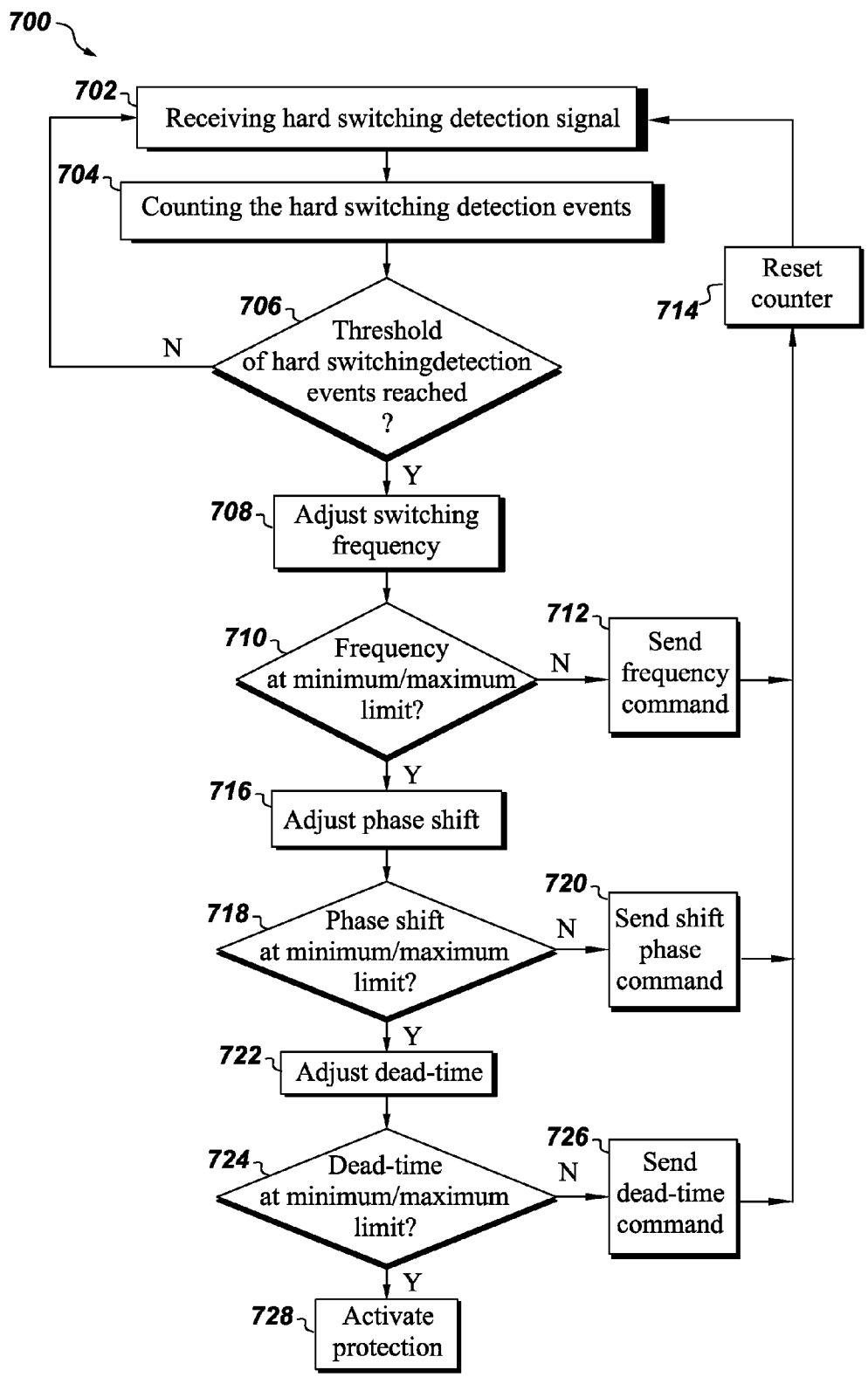
FIG. 7 is a flow chart representation of a method controlling converter of FIG. 3, according to aspects of the present disclosure.

FIG. 7 shows a flow chart 700 depicting a method of controlling converter 300 of FIG. 3 in accordance with an embodiment of the present technique. The method includes receiving hard switching detection signal at step 702. In one embodiment, the hard switching detection signal is received from hard switching detector 404. In step 704, the method includes counting the number of hard switching events i.e., pulses. Further, in step 706 it is determined whether a threshold of hard switching events is reached. The determination in step 706 includes multiplying the number of hard switching detection events with a power level signal and comparing the result i.e., the product with the threshold number. If the threshold is reached then in step 708 switching frequency of the converter 300 is adjusted. Further, in step 710, it is determined whether a maximum or minimum limit of the switching frequency of the converter is reached. If the switching frequency limit is not reached then the switching frequency command is sent to the converter in step 712. The converter switching frequency is then adjusted and the converter restarts its operation in soft switching mode. Further, in step 714 the counter which counts the hard switching events is also reset. This makes sure that at the next instance of hard switching even the counter starts counting the pulses again. However, if switching frequency limit is reached then in step 710 then the method proceeded to step 716.

In step 716, the converter phase shift is adjusted so as to operate the converter in soft switching mode. As with switching frequency, in step 718, it is determined whether the phase shift has reached its maximum or minimum limit. If the phase shift limit is not reached then in step 720, the new phase shift command is sent to the converter. The converter phase shift is then adjusted and the converter restarts its operation in soft switching mode. Further, in step 714, the counter is reset so as to start the new cycle.

If phase shift limit is reached in step 718, then in step 722, a converter dead time is adjusted to operate the converter in soft switching mode. As with switching frequency and phase shift, in step 724, it is determined whether the dead time has reached its maximum or minimum limit. If the limit is reached then the converter protection is activated in step 728 else the new dead time command is sent to the converter in step 726 and again in step 714, the counter is reset. It should be noted that activating converter protection in step 728 includes tripping the converter so as to protect it from overvoltage or overcurrent occurring due to prolonged operation in hard switching mode.

Figure 8:
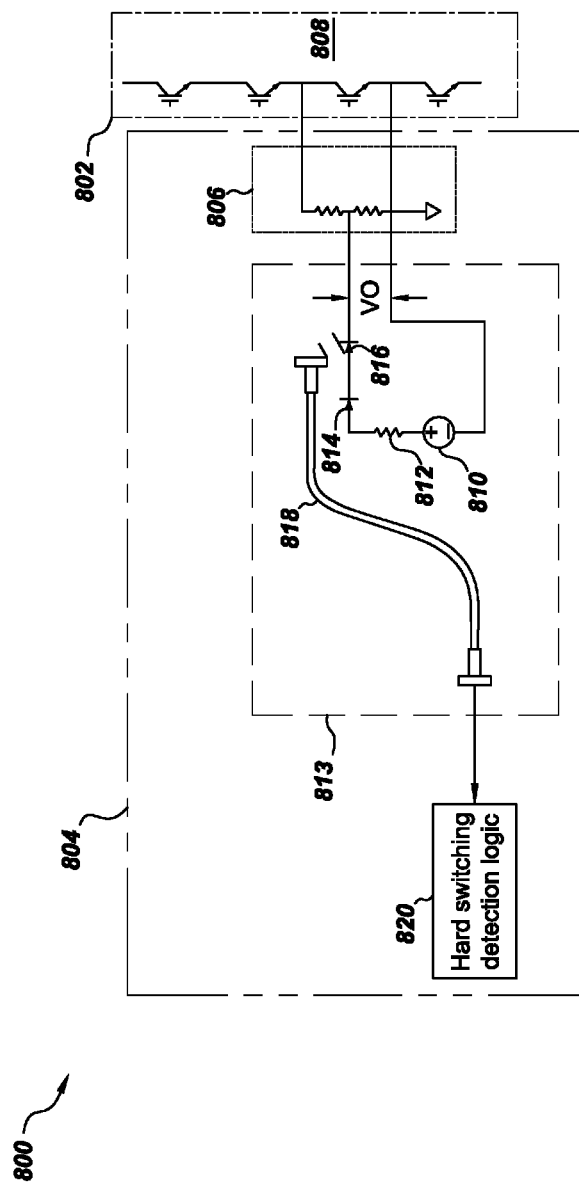
FIG. 8 is a schematic representation of a converter section and another hard switching detector, according to aspects of the present disclosure.

FIG. 8 shows a schematic representation of 800 of a converter section 802 and another hard switching detector 804 in accordance with an embodiment of the present technique. As compared to hard switching detector 404 of FIG. 4, hard switching detector 804 does not use any comparator. This makes hard switching detector 804 less susceptible to the noise.

In general hard switching detector 804 includes a voltage divider circuit 806 which is connected across a switching device 808 of converter section 802 and a hard switching pulse signal detector 813 which generates a pulse when a hard switching instance of the switching device 808 is detected. The voltage divider circuit 806 detects a device voltage Vd across switching device 808. Further, hard switching pulse signal detector 813 includes an optical transmitter 816.

Hard switching pulse signal detector 813 further includes a reference voltage source 810 having a reference voltage Vr which is connected in series with a current limiting resistor 812, a blocking diode 814 and the optical transmitter 816. Further, an output voltage V0 generated by voltage divider circuit 806 is applied across the circuit formed by reference voltage source 810, current limiting resistor 812, blocking diode 814 and optical transmitter 816. As can be seen from FIG. 8, the current in the optical transmitter 816 depends on the output voltage V0 of the voltage divider circuit 806 and the reference voltage Vr of the reference voltage source 810. For example, if voltage Vr is equal to voltage V0 then no current will flow through optical transmitter 816. On the contrary if voltage Vr is higher than voltage V0 then a current equivalent to (Vr−V0/Rc) may flow through optical transmitter 816, where Rc is the resistance of the current limiting resistor 812. Moreover, it should be noted that if the voltage V0 is greater than voltage Vs no current will flow through the optical transmitter 816 as the blocking diode 814 will become reverse biased then. Further, when the device 808 is operating under the soft switching mode the voltage V0 will be higher than voltage Vr. However, when the device 808 is operating under the soft switching mode the voltage V0 may be lower than voltage Vs causing the current to flow through the optical transmitter 816.

Further, when the current flows through the optical transmitter 816, it produces a pulse which is transmitted to hard switching detection logic module 820 by a fiber optic cable 818. The hard switching detection logic module 820 works similar in the manner explained with respect to FIG. 7.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power converter, comprising:
a first bus converter for converting a first DC bus voltage into a first high frequency alternating current (AC) voltage;
a second bus converter for converting a second high frequency AC voltage into a second DC bus voltage;
a resonant circuit for coupling the first bus converter and the second bus converter;
a controller for providing switching signals to the first bus converter and the second bus converter to operate the power converter in a soft switching mode, wherein the controller comprises:

a voltage detection circuit connected across at least one switching device of the power converter to detect a device voltage across the at least one switching device;

a hard switching pulse signal detector to generate hard switching detection pulses based on the device voltage and a reference voltage when a hard switching instance of the at least one switching device is detected;

a counter to count a number of hard switching detection pulses of the hard switching pulse signal detector;

a calculation module to update the number of hard switching detection pulses of the hard switching instances and to generate a new number of hard switching detection pulses;

a comparator to compare the new number of hard switching detection pulses with a threshold value and to provide a control signal if the new number exceeds the threshold value.

2. The power converter of claim 1, wherein the voltage detection circuit includes a voltage divider circuit which generates the device voltage based on a ratio of resistors of the voltage divider.

3. The power converter of claim 1, wherein the hard switching pulse signal detector comprises a comparator to compare the device voltage and the reference voltage and to generate a first detection signal.

4. The power converter of claim 3, wherein the hard switching pulse signal detector further comprises a delay module to delay the first detection signal a delay time.

5. The power converter of claim 4, wherein the hard switching pulse signal detector comprises a logic gate to compare the delayed first detection signal with a gate signal of the switching device to provide hard switching detection pulses.

6. The power converter of claim 1, wherein the hard switching pulse signal detector comprises an optical transmitter to generate hard switching detection pulses.

7. The power converter of claim 6, wherein the optical transmitter is connected between the voltage divider circuit and a reference voltage source having the reference voltage and generates hard switching detection pulses when the reference voltage is higher than the device voltage.

8. The power converter of claim 7, wherein the hard switching pulse signal detector further comprises a current limiting resistor to limit the current through the optical transmitter.

9. The power converter of claim 7, wherein the hard switching pulse signal detector comprises a blocking diode to block a current to flow from the voltage divider circuit to the reference voltage source.

10. The power converter of claim 1, wherein the calculation module includes a multiplier to multiply the number of hard switching detection pulses with a per unit power of the power converter to generate the new number of hard switching detection pulses.

11. The power converter of claim 1, wherein the control signal comprises a switching frequency command, a phase shift command, a dead time command, a trip signal command or combinations thereof.

12. The power converter of claim 11, wherein the switching frequency command, the phase shift command and the dead time command are determined based on minimum and maximum limits.

13. A method of operating a power converter having a first bus converter coupled to a second bus converter by a resonant circuit, said method comprising:

detecting a device voltage across at least one switching device of the first bus converter or the second bus converter;

generating hard switching detection pulses based on the device voltage and a reference voltage when a hard switching instance of the at least one switching device is detected;

counting a number of hard switching detection pulses of the hard switching instances of the at least one switching device;

updating the number of hard switching detection pulses with a new number of hard switching detection pulses;

comparing the new number of hard switching detection pulses with a threshold value; and generating a control signal if the new number of hard switching detection pulses exceeds the threshold value.

14. The method of claim 13, wherein generating hard switching detection pulses includes comparing the device voltage and the reference voltage to generate a first detection signal.

15. The method of claim 13, wherein generating hard switching detection pulses further includes delaying the first detection signal a delay time.

16. The method of claim 13 further comprising compare the delaying first detection signal with a gate signal of the switching device to provide hard switching detection pulses.

17. The method of claim 13, wherein generating hard switching detection pulses includes providing a voltage difference of the reference voltage and the device voltage across a series connection of an optical transmitter, a current limiting resistor and a blocking diode.

18. The method of claim 13, wherein updating the number of hard switching detection pulses comprises multiplying the number of hard switching detection pulses with a per unit power of the power converter to generate the new number of hard switching detection pulses.

19. The method of claim 13, wherein the control signal comprises a switching frequency command, a phase shift command, a dead time command, a trip signal command or combinations thereof.

* * * * *